US006414308B1

United States Patent
Bowley, Jr.

(10) Patent No.: US 6,414,308 B1
(45) Date of Patent: Jul. 2, 2002

(54) METHOD FOR DETERMINING OPENED/ UNOPENED SEMICONDUCTOR CONTACTS USING A SCANNING ELECTRON MICROSCOPE

(75) Inventor: Reginald R. Bowley, Jr., Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/268,170

(22) Filed: Mar. 12, 1999

(51) Int. Cl.[7] .............................................. H01J 37/00
(52) U.S. Cl. ...................................... 250/310; 250/307
(58) Field of Search ................................. 250/310, 306, 250/307

(56) References Cited

U.S. PATENT DOCUMENTS

| 5,412,209 A | * | 5/1995 | Otaka et al. ................. 250/310 |
| 5,412,210 A | | 5/1995 | Todokoro et al. |
| 5,493,116 A | | 2/1996 | Toro-Lira et al. |
| 5,550,372 A | | 8/1996 | Yasue |
| 5,594,245 A | | 1/1997 | Todokoro et al. |
| 5,608,218 A | * | 3/1997 | Sato et al. .................. 250/310 |
| 5,659,172 A | | 8/1997 | Wagner et al. |
| 5,736,863 A | | 4/1998 | Liu |
| 5,761,064 A | | 6/1998 | La et al. |
| 5,783,366 A | | 7/1998 | Chen et al. |
| 5,872,358 A | * | 2/1999 | Todokoro et al. ........... 250/310 |
| 5,986,263 A | * | 11/1999 | Hiroi et al. ................. 250/310 |
| 6,232,787 B1 | * | 5/2001 | Lo et al. ..................... 250/310 |

FOREIGN PATENT DOCUMENTS

| JP | 7-296759 | 11/1995 |
| JP | 10-74813 | 3/1998 |

OTHER PUBLICATIONS

IBM Technical Disclosure Bulletin, "Deep Via Inspection Method by Absorbed Electron Image", vol. 39, No. 03, Mar. 1996, pp. 255–258.

IBM Technical Disclosure Bulletin, "Using the Scanning Electron Microscope as an Etch Process Monitoring Tool", vol. 30, No. 12, May 1988, pp. 485–486.

* cited by examiner

Primary Examiner—Kiet T. Nguyen
(74) Attorney, Agent, or Firm—McGinn & Gibb, PLLC; Howard J. Walter, Jr.

(57) ABSTRACT

A method for inspecting a plurality of similar structures in the surface of a workpiece includes providing a workpiece having a plurality of regions, each of the regions including at least two different materials, generating an image from each of the regions such that an image contrast between the two materials is enhanced and classifying the images into at least two classes including an acceptable class of images and unacceptable class of images.

20 Claims, 2 Drawing Sheets

METHOD FOR DETERMINING OPENED/ UNOPENED SEMICONDUCTOR CONTACTS USING A SCANNING ELECTRON MICROSCOPE

BACKGROUND OF THE INVENTION

1. Field of the Invention

The present invention generally relates to systems for testing contact holes in integrated circuit devices and more particularly to a system using a scanning electron microscope to test contact holes.

2. Description of the Related Art

Contact holes in integrated circuit devices (e.g., semiconductor devices) allow vertical interconnections between various layers. Inspection of the bottom of contact holes is difficult due to the high aspect ratios of such holes. Holes with high aspect ratios are generally very deep relative to their width. Thus, the aspect ratio generally increases as devices are continually made smaller and contact hole diameters shrink.

Conventional systems that determine whether contacts holes are open at the bottom involve a destructive cross-sectional inspection using a high voltage scanning electron microscope (SEM), where the contacts are cleaved in half and imaged perpendicular to the contact axis. This method is expensive, time-consuming, and unable to provide timely feedback to the contact processes. The invention overcomes these problems, as discussed below.

SUMMARY OF THE INVENTION

It is, therefore, an object of the present invention to provide a structure and method for inspecting a plurality of similar structures in the surface of a workpiece, wherein the method includes providing a workpiece having a plurality of regions, each of the regions including at least two different materials, generating an image from each of the regions such that an image contrast between the two materials is enhanced and classifying the images into at least two classes including an acceptable class of images and unacceptable class of images.

The generating process is performed by applying a scanning electron microscope to the regions. The classifying includes determining, on a graduated scale, an amount of acceptability of the images.

The regions are contact openings and the acceptable class of images includes opened contact openings and the unacceptable class of images includes closed contact openings. The classifying includes determining, on a graduated scale, an amount the contact openings are opened.

Another embodiment of the invention is a method of inspecting openings extending through a first layer of a structure to a second layer of the structure, where the method includes positioning an electron microscope above the structure, generating an electric field between the structure and the electron microscope, and scanning the structure with the electron microscope to generate an image of the structure, wherein the first layer appears differently than the second layer, such that openings extending through the first layer to the second layer appear as contrasting features in the image.

The openings have a pattern and the method further comprises identifying ones of the openings that do not extend fully through the first layer, based on the pattern. Also, the invention determines, on a graduated scale, an amount that the openings extend through the first layer. The process of identifying ones of the openings that do not extend fully through the first layer comprises automatically evaluating the images using a computer system.

In one example, the structure comprises a semiconductor device and the openings comprise contact openings. The invention also includes selecting the first layer and the second layer to contrast each other on the image. The scanning process includes scanning a portion of the image in one of an "X" pattern and a "Y" pattern.

Another embodiment of the invention is a computer system, tangibly embodying a program of instructions executable by the machine to perform a method of inspecting openings extending through a first layer of a structure to a second layer of the structure, where the method comprises positioning an electron microscope above the structure, generating an electric field between the structure and the electron microscope and scanning the structure with the electron microscope to generate an image of the structure, wherein the first layer appears differently than the second layer, such that openings extending through the first layer to the second layer appear as contrasting features in the image.

Benefits of the invention include substantially improved feedback time to the etch processes to improve etch quality. Also, the invention is able to inspect a much larger sample of chips/wafers than destructive cross-sectioning can, to enable a more complete picture of etch quality.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

Figure 1:
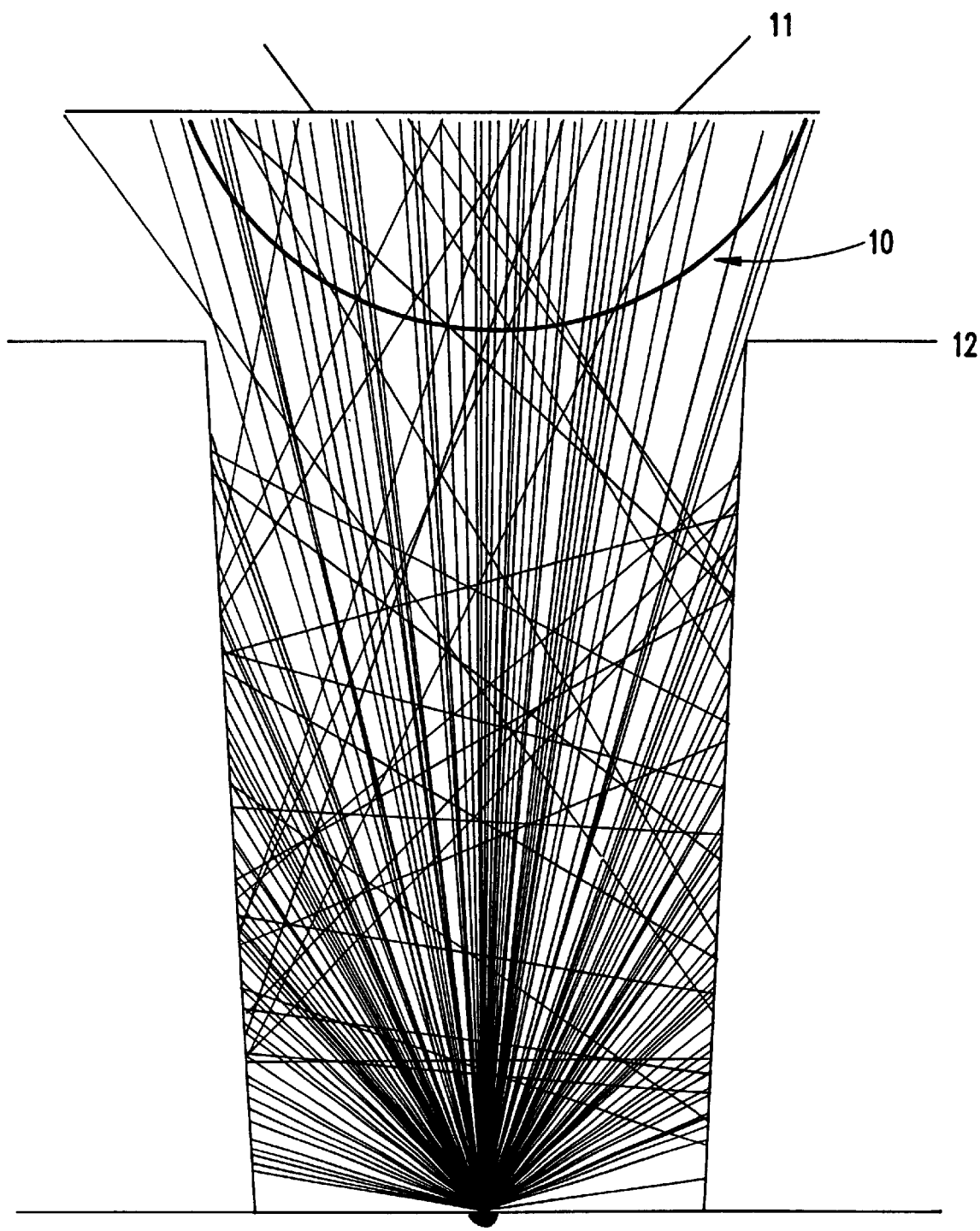
FIG. 1 is a schematic diagram of an electric field between a contact hole and an objective lens of a scanning electron microscope.

In a preferred embodiment, the invention utilizes an in-line, low voltage, critical dimension scanning electron microscope (CDSEM) to enhance the material contrast between opened and unopened contacts. However, the invention does not require a CDSEM; any SEM will work, so long as it is equipped with the ability to impart an extraction field 10 between the final objective lens 11 and the wafer surface 12 as shown in FIG. 1.

Imparting an electric field 10 between the item being examined and the electron microscope is a technique well known to those ordinarily skilled in this art field. For example, electron microscopes from Applied Materials, Inc. (AMAT) located in Santa Clara, Calif., U.S.A. have the ability to impart such an electric field.

The invention uses an SEM in two modes: standard SEM mode with accelerating voltages ranging from 300 eV to 3000 eV, and HAR (high aspect ratio) mode, which combines the standard accelerating voltages with either a 1000 eV or 3000 eV extraction field. The invention uses 0.53 KeV, which is "shorthand" for a 500 eV accelerating voltage with a 3000 eV extraction field.

Conventional systems do not impart such an electric filed when examining contact holes on wafers. Instead, some conventional systems create an electric field on the wafer (e.g., through wafer contact) and do not utilize a non-contact electric field between the wafer and the electron microscope as the invention does.

More specifically, some conventional systems include a test structure having varying sizes of contact holes which requires a bias voltage be induced to the underlying conductive layer. The interaction between the e-beam and the biased structure creates a contrast differential known as voltage contrast. To the contrary, the invention does not use voltage contrast, or any special test structure and the invention does not induce a voltage to the wafer substrate. Instead, the invention creates an electric field 10 between the wafer 12 and the SEM 11.

Thus, the invention utilizes the electric field 10 between the wafer 12 and the SEM 12 when examining contact openings to dramatically increase the contrast between the different material layers and more clearly identify which contacts which are fully open and which are fully closed. Further, because of the increased contrast with the invention, a more graduated scale indicating the amount that the contact hole is open is also produced with the invention. Thus, with the invention, partially opened contacts are also seen because of the increased contrast between fully opened and fully closed contact openings.

The invention determines the amount the contact is opened by observing the gray scale of the contrast. A light indication (e.g. mostly white) on the scanning electron microscope indicates that the contact is nearly fully opened. To the contrary, a dark indication (mostly black) on the scanning electron microscope indicates that the contact is nearly fully closed. Less dark and less light indications on the scanning electron microscope therefore indicate different degrees of contact opening. Therefore, the invention is not limited to "open" or "closed" contacts and instead produces a variable scale showing the amount that the contact hole is opened.

When programming the invention for inspection, standard conditions "fake" bad contacts to tune the material selection and SEM settings to produce the largest amount of contrast. Material contrast is the electron yield resulting from interaction of an electron beam with materials of differing atomic number. The electron yield is greater from higher atomic number materials because more inelastic collisions occur as the atomic density increases with higher atomic number materials. Therefore, higher atomic number materials exhibit higher contrast through the scanning electron microscope.

Figure 2:
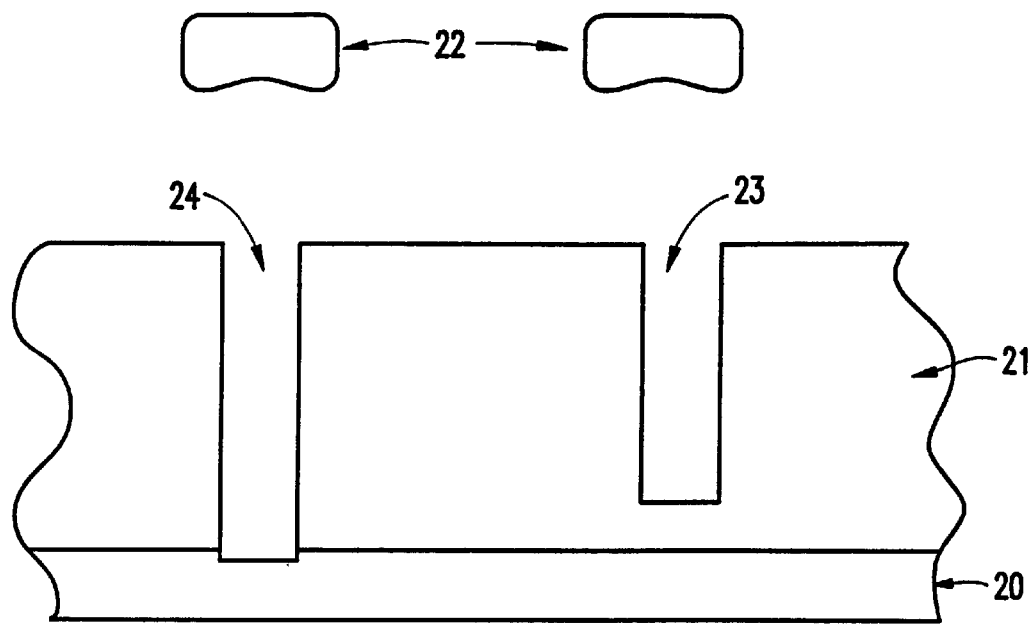
FIG. 2 is a schematic diagram of a structure having contact openings and a scanning electron microscope.

FIG. 2 illustrates an example of opened and unopened contact holes. More specifically, contact holes 24 that are open to an underlying layer 20 will have a different bottom material 20 than those which are unopened 23. Thus, contact holes 24 which are properly opened to the substrate 20 will have the substrate surface 20 as a bottom. To the contrary, the bottom of a contact hole 23 which is not properly opened (e.g., closed contacts) will simply be the material 21 through which the contact opening 23 was formed.

The invention selects the SEM 22 conditions to enhance the difference in electron yield from one type of material to another, allowing easy detection of these materials in the bottom of contact holes 23, 24. Therefore, for example, the invention uses a silicon substrate 20 and a phosphorous silicate glass (PSG) insulator material 21 because silicon shows bright in the SEM, while PSG shows dark in the SEM.

However, the material selection of the substrate and insulator are not limited to the specific material shown herein. Instead, all is required with the invention is to differentiate between the contact layer and the next underlying layer. As long as the topmost layer is different than the underlying layer, the invention can light-up the contacts. For example, the invention can differentiate between BPSG over copper, nitride over titanium silicide, etc.

The invention also alters the SEM conditions to maximize contrast. For example, the invention alters the combined accelerating voltage, beam current, magnification, scan rate and dwell time to tailor the electron dosage to enhance the material contrast. In a like manner, the accelerating voltage can be set in the range of 500 eV to 3000 eV for a silicon substrate 20 and PSG is used as the insulator 21. Similarly, the beam current is preferably set in the range of 7 pA to 14 pA and is preferably 6 pA for a silicon substrate 20 and PSG is used as the insulator 21. Also, the magnification is preferably set in the range of 5 $\mu$m to 60 $\mu$m and is preferably 10–30 $\mu$m for a silicon substrate 20 and PSG is used as the insulator 21. Similarly, the scan rate is preferably a continuous scan at TV rates. Further, the dwell time is preferably set in the range of 1 sec to 4 sec.

The invention also includes an automated recipe that performs limited inspection (e.g., samples) of various areas of the semiconductor wafer for opened or closed contacts and estimates the quality of the areas not tested based on the samples taken. More specifically, the invention may only sample a few wafers from each sample (e.g., the first, middle and last). Additionally, the invention may only sample the contact openings in an X or Y pattern on the wafer.

Automating the inspection technique is an important feature of the invention. Given that the invention had the ability to see opened/unopened contacts, and sample any number of sites on any number of wafer, resolving the automation requirement is crucial. The alternatives to developing an automated recipe are to either a) have an operator make judgments on good vs. bad contacts, or b) take quantities of photographs for review later. Neither of these options produces the advantages that the invention does in a manufacturing environment.

Figure 3:
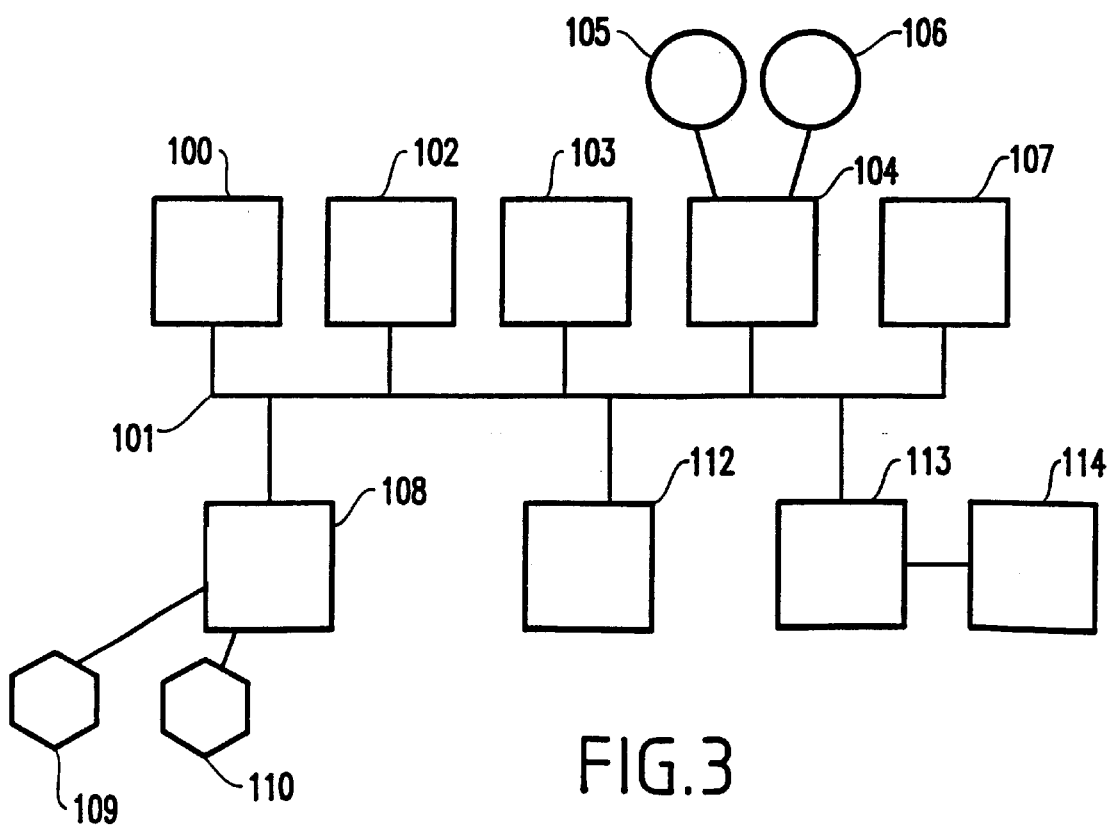
FIG. 3 is a schematic diagram of a computer system used to implement the invention.

An exemplary computer system for implementing the invention is shown in FIG. 3 and preferably has at least one processor or central processing unit (CPU) 100. The CPU 100 is interconnected via a system bus 101 to a random access memory (RAM) 102, read-only memory (ROM) 103, input/output (I/O) adapter 104 (for connecting peripheral devices such as disk units 105 and tape drives 106 to the bus 101), communication adapter 107 (for connecting an information handling system to a data processing network) user interface adapter 108 (for connecting a peripherals 109, 110 such as a keyboard, mouse, microphone speaker and/or other user interface device to the bus 101), a printer 112, and display adapter 113 (for connecting the bus 101 to a display device 114). The invention could be implemented using the structure shown in FIG. 3 by including the inventive method within a computer program stored on the storage device 105. Such a computer program would act on information supplied through the interface units 109, 110 or through the network connection 107. The system would then automatically produce the final desired product on the display 114, through the printer 112 or back to the network 107.

The automated recipe makes use of the SEM's pattern recognition capabilities, whereby the pattern recognition system can recognize a trained image. In other words, the invention can automatically recognize a pattern of openings formed on the wafer and note areas where contact holes were not formed but should have been according to the pattern. In one example, the inventive pattern recognition system is trained to look for a black contact, i.e. one that is underetched or "closed". Further, if the invention sees a black contact, it then measures the darkness of the contact (using conventional, well known techniques). The presence of a measurement is the invention's flag. The actual measured value is not as important as the flag itself.

During operation, the SEM stage is driven to preprogrammed coordinates. At the programmed SEM conditions, pattern recognition is performed and attempts to locate a black contact. Note that the invention can adjust the sensitivity of the underetched contact detection by training the pattern recognition to look for more than one contact, where the highest sensitivity is obtained when scanning for one contact; scanning for two or more contacts would decrease the sensitivity as there is a lesser probability of having n number of contacts in a trained pattern be bad.

As mentioned, the invention can inspect any number of locations on any number of wafers. The invention typically samples a X/Y cross pattern of chips on the first, middle and last wafers of a 25-wafer lot.

Upon completion of the inspection, data consisting of a combination of null data points (indicating good etching, as no black contacts were detected and no measurements obtained) or actual measurement values (indicating bad etching) are sent to a statistical process control (SPC) chart of the etch system which performed the actual etching on the wafers being inspected. Any measurement value >0 will "inhibit" the etch system, which means an undesirable condition or malfunction occurred in the etch system, which must be resolved before any processing on that system can continue.

Benefits of the invention include substantially improved feedback time to the etch processes to increase etch quality. Conventional cross-section results are not only expensive but typically require several hours (at best) before results are fed back to the etch process, meaning potentially bad etching (which cannot be reworked) may continue as they are awaiting cross-section results. The inventive non-destructive inspection process reduces feedback time to <1 hour. Also, the invention is able to inspect a much larger sample of chips/wafers than destructive cross-sectioning can, to enable a more complete picture of etch quality.

In a preferred embodiment of the invention the sampling is used to evaluate process centering by comparing the etch quality of various etch processes. The invention can also be used to evaluate some photolithography processing, whereby focus and/or exposure matrices are exposed and etched, then inspected to determine which focus and/or exposure conditions yielded open contacts after etching.

As would be known by one ordinarily skilled in the art, the invention is not limited to testing contact openings and can be used to test vias (which are contacts interconnecting metal wiring layers) as well as elongated contact openings known as "bars", which have very low aspect ratios than contacts because they are much wider in one axis. Further, with the invention, no special test structure is required because the invention performs inspection on standard production wafers.

While the invention has been described in terms of preferred embodiments, those skilled in the art will recognize that the invention can be practiced with modification within the spirit and scope of the appended claims.

What is claimed is:

1. A method of inspecting a plurality of similar structures in the surface of a workpiece comprising:

providing a workpiece having a plurality of regions, each of said regions including at least two different materials;

utilizing a non-contact electric field between said wafer and an image capture apparatus;

generating an image from each of said regions such that an image contrast between said two materials is enhanced by said non-contact electric field; and classifying the images into at least two classes including an acceptable class of images and an unacceptable class of images.

2. The method in claim 1, wherein said generating comprises applying a scanning electron microscope to said regions.

3. The method in claim 1, wherein said classifying includes determining, on a graduated scale, an amount of acceptability of said images.

4. The method in claim 1, wherein said regions comprise contact openings and said acceptable class of images includes opened contact openings and said unacceptable class of images includes closed contact openings.

5. The method in claim 4, wherein said classifying includes determining, on a graduated scale, an amount said contact openings are opened.

6. The method in claim 1, wherein said classifying comprises automatically evaluating said images using a computer system.

7. A method of inspecting openings extending through a first layer of a structure to a second layer of said structure, said method comprising:

positioning an electron microscope above said structure;

generating a non-contact electric field between said structure and said electron microscope; and scanning said structure with said electron microscope to generate an image of said structure, wherein said non-contact electric field causes said first layer to appear differently than said second layer, such that openings extending through said first layer to said second layer appear as contrasting features in said image.

8. The method in claim 7, wherein said openings have a pattern and said method further comprises identifying ones of said openings that do not extend fully through said first layer, based on said pattern.

9. The method in claim 8, further comprising determining, on a graduated scale, an amount that said openings extend through said first layer.

10. The method in claim 8, wherein said identifying ones of said openings that do not extend fully through said first layer comprises automatically evaluating said images using a computer system.

11. The method in claim 7, wherein said structure comprises a semiconductor device and said openings comprise contact openings.

12. The method in claim 7, further comprising selecting said first layer and said second layer to contrast each other on said image.

13. The method in claim 7, wherein said scanning comprises scanning a portion of said image in one of an "X" pattern and a "Y" pattern.

14. A computer system, tangibly embodying a program of instructions executable by the machine to perform a method of inspecting openings extending through a first layer of a structure to a second layer of said structure, said method comprising:

positioning an electron microscope above said structure;

generating a non-contact electric field between said structure and said electron microscope; and scanning said structure with said electron microscope to generate an image of said structure, wherein said non-contact electric field causes said first layer to appear differently than said second layer, such that openings extending through said first layer to said second layer appear as contrasting features in said image.

15. The computer system in claim 14, wherein said openings have a pattern and said method further comprises identifying ones of said openings that do not extend fully through said first layer, based on said pattern.

16. The computer system in claim 15, wherein said method further comprises determining, on a graduated scale, an amount that said openings extend through said first layer.

17. The computer system in claim 15, wherein said identifying ones of said openings that do not extend fully through said first layer comprises automatically evaluating said images using said computer.

18. The computer system in claim 14, wherein said structure comprises a semiconductor device and said openings comprise contact openings.

19. The computer system in claim 14, wherein said method further comprises selecting said first layer and said second layer to contrast each other on said image.

20. The computer system in claim 14, wherein said scanning comprises scanning a portion of said image in one of an "X" pattern and a "Y" pattern.

* * * * *